(12) United States Patent
Mellies

(10) Patent No.: US 7,919,445 B2
(45) Date of Patent: Apr. 5, 2011

(54) AQUEOUS SOLUTION FOR REMOVING POST-ETCH RESIDUE

(75) Inventor: Raimund Mellies, Dieburg (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 987 days.

(21) Appl. No.: 10/594,767

(22) PCT Filed: Mar. 10, 2005

(86) PCT No.: PCT/EP2005/002511
§ 371 (c)(1),
(2), (4) Date: Jan. 18, 2007

(87) PCT Pub. No.: WO2005/098920
PCT Pub. Date: Oct. 20, 2005

(65) Prior Publication Data
US 2007/0161243 A1    Jul. 12, 2007

(30) Foreign Application Priority Data
Mar. 30, 2004 (EP) .................................. 04007627

(51) Int. Cl.
*H01L 21/302* (2006.01)
(52) U.S. Cl. ........................... 510/175; 252/79.1
(58) Field of Classification Search ............... 510/175; 252/79.1
See application file for complete search history.

(56) References Cited

U.S. PATENT DOCUMENTS

| | | | |
|---|---|---|---|
| 6,156,661 A | 12/2000 | Small | |
| 6,199,567 B1 | 3/2001 | Kanno et al. | |
| 6,200,947 B1 | 3/2001 | Takashima et al. | |
| 6,361,407 B1 | 3/2002 | Lu et al. | |
| 6,391,794 B1 | 5/2002 | Chen et al. | |
| 6,417,112 B1 | 7/2002 | Peyne et al. | |
| 6,530,968 B2 * | 3/2003 | Tsuchiya et al. | 51/307 |
| 2002/0048953 A1 | 4/2002 | Nayak | |
| 2003/0004085 A1 * | 1/2003 | Ando et al. | 510/438 |
| 2003/0143857 A1 | 7/2003 | Andreas | |
| 2004/0053800 A1 | 3/2004 | Zhang et al. | |
| 2004/0167047 A1 | 8/2004 | Ishikawa et al. | |
| 2005/0181609 A1 * | 8/2005 | Kurata et al. | 438/689 |
| 2005/0205835 A1 * | 9/2005 | Tamboli et al. | 252/79.1 |
| 2006/0042502 A1 * | 3/2006 | Sato et al. | 106/10 |
| 2007/0235061 A1 * | 10/2007 | Mizuta et al. | 134/2 |

FOREIGN PATENT DOCUMENTS

| | | |
|---|---|---|
| DE | 41 40 181 A1 | 6/1993 |
| EP | 0 068 277 A1 | 1/1983 |
| EP | 0 485 161 A1 | 5/1992 |
| EP | 0 896 042 A1 | 2/1999 |
| EP | 1 024 521 A2 | 8/2000 |
| EP | 1 063 689 A1 | 12/2000 |
| EP | 1 139 401 A1 | 10/2001 |
| JP | 11-233405 | 8/1999 |
| JP | 2000-273663 | 10/2000 |
| JP | 2001-7071 | 1/2001 |

(Continued)

*Primary Examiner* — Gregory E Webb
(74) *Attorney, Agent, or Firm* — Oblon, Spivak, McClelland, Maier & Neustadt, L.L.P.

(57) ABSTRACT

The present invention relates to a novel solution for the removal of post-etch residues having improved properties and to the use thereof in the production of semiconductors. The invention relates, in particular, to an aqueous solution having a reduced etching rate on metallisations and on surfaces which have to be freed from post-etch residues and particles during the semiconductor production process.

18 Claims, 9 Drawing Sheets

Comparison: vias before PER cleaning

FOREIGN PATENT DOCUMENTS

| | | |
|---|---|---|
| JP | 2001-26890 | 1/2001 |
| JP | 2001-523356 | 11/2001 |
| JP | 2003-257922 | 9/2003 |
| JP | 2003-316029 | 11/2003 |
| WO | WO 98/50516 | 11/1998 |
| WO | WO 99/63404 | 12/1999 |

* cited by examiner

Figure 1: Comparison: vias before PER cleaning
 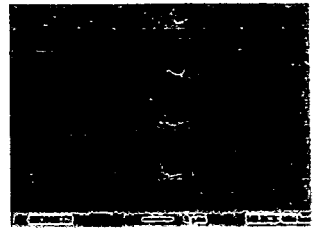
Figure 2: Tank unit, vias after cleaning for 5 min
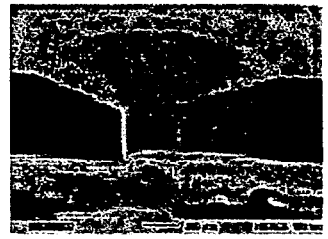 
Figure 3: Spray tool (Semitool SAT), vias after cleaning for 20 min
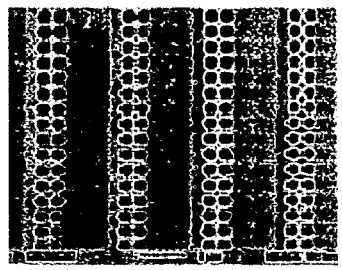 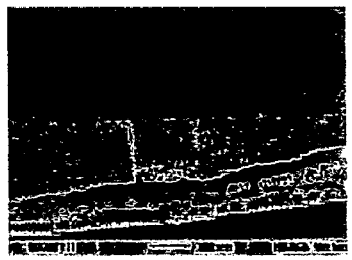
Figure 4: Spray tool (Semitool SAT), Al/Cu 5 min, 45°C, with DSP
 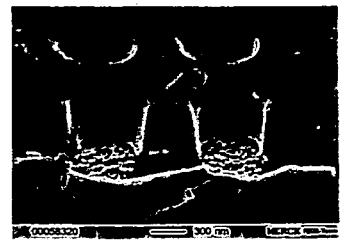

Figure 7: After cleaning for 20 min at 60°C with tartaric acid 5% / NMP 1% / enanthic acid 1000 ppm
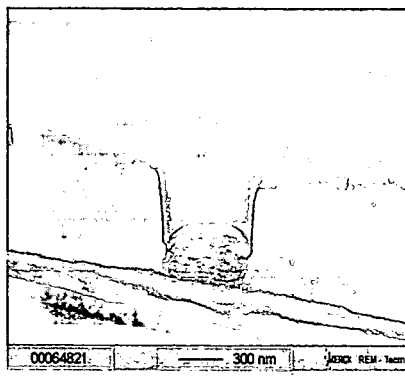
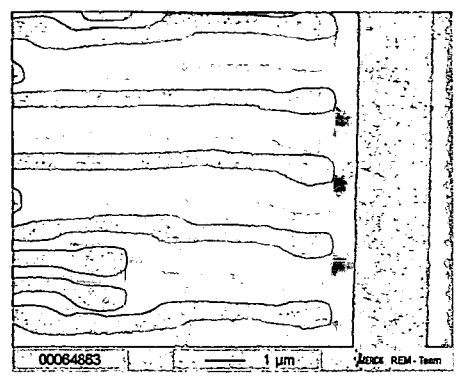
Figure 8: After cleaning for 20 min at 60°C with tartaric acid 5% / DMSO 1% / enanthic acid 1000 ppm
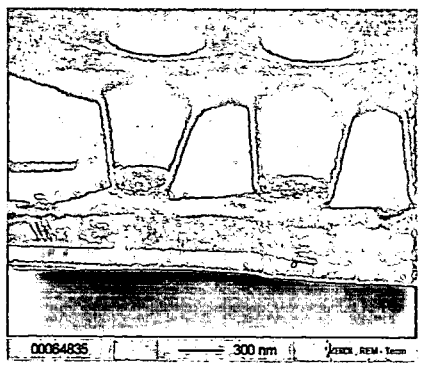
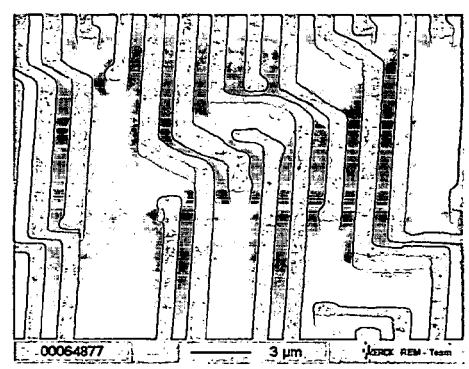
Figure 9: After cleaning for 20 min at 60°C with tartaric acid 5% / PGMEA 1% / enanthic acid 1000 ppm
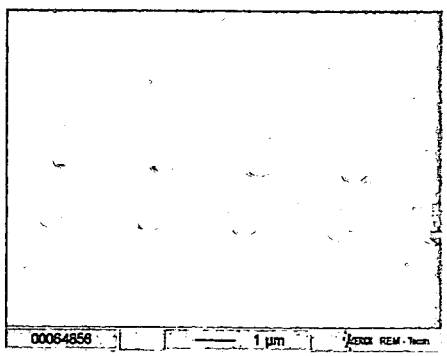
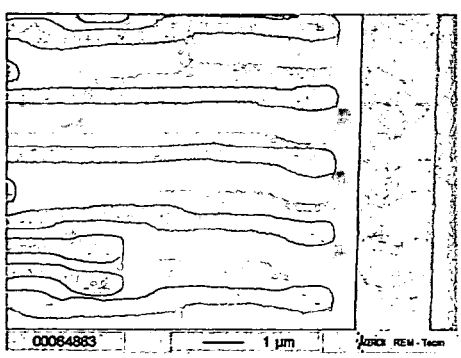

Figure 10: After cleaning for 20 min at 60°C with maleic acid 5% / NMP 1% / enanthic acid 1000 ppm
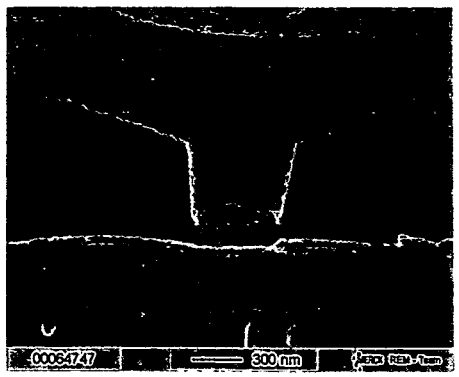
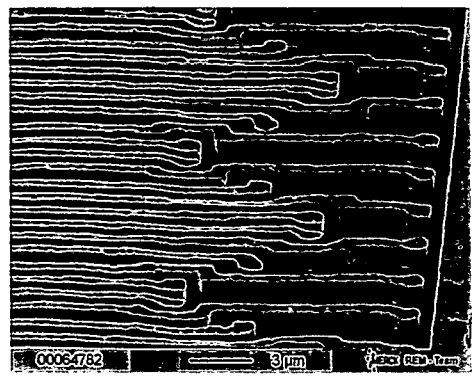
Figure 11: After cleaning for 20 min at 60°C with maleic acid 5% / DMSO 1% / enanthic acid 1000 ppm
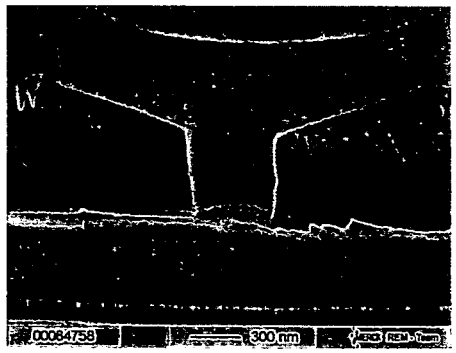
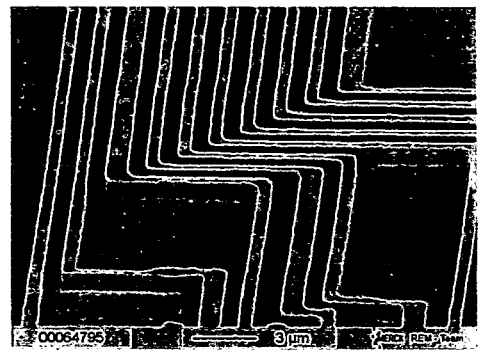
Figure 12: After cleaning for 20 min at 60°C with maleic acid 5% / PGMEA 1% / enanthic acid 1000 ppm
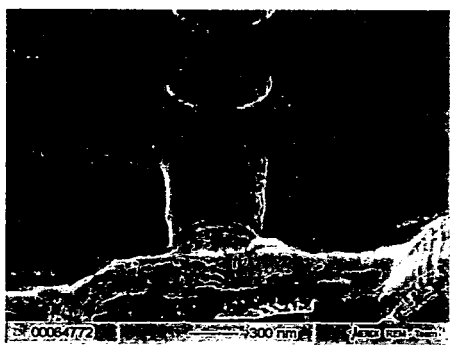

AQUEOUS SOLUTION FOR REMOVING POST-ETCH RESIDUE

The present invention relates to a novel solution for the removal of post-etch residues having improved properties and to the use thereof in the production of semiconductors. The invention relates, in particular, to an aqueous solution having a reduced etching rate on metallisations and on surfaces which have to be freed from post-etch residues and particles during the semiconductor production process.

PRIOR ART

Back-end-of-line (BEOL) metallisations (conductor tracks) on semiconductor components essentially consist of an aluminium/copper layer having a copper content of <0.5% applied by sputtering. BEOL metallisations for aluminium technology are produced by photolithography. The dielectric used is an $SiO_2$ layer between the individual metal layers, which are connected vertically by via studs (tungsten or aluminium). The structures (conductor tracks and vias) are produced by the reactive ion etching process. The BEOL metallisations are usually produced by the following process steps (1) to (6):

Process Sequence for the Production of Al/Cu Conductor Tracks:

1. Full-area sputtering of the following layers on an $SiO_2$ insulation layer:
   a. Thin Ti/TiN layer as diffusion barrier
   b. AlCu metallisation layer
   c. Thin Ti/TiN layer as antireflective coating (ARC)
2. Application of the positive photoresist by spin coating with subsequent exposure and development of the structures
3. Etching: reactive ion etch (RIE) using halogen-containing etching gases
4. Ashing of the photoresist in an oxygen or $H_2O$ plasma, optionally with addition of $CF_4$
5. Deionised water spraying process (cold, hot)
6. Removal of the PERs by means of wet processes.

During the 3rd step, the so-called post-etch residues form, preferentially on the side walls of the aluminium conductor tracks. They change their chemical composition during performance of the 4th and 5th steps. The PERs must be removed completely before carrying out the following process steps in the 6th step.

The vertical electrical connections between the metal layers are holes in the $SiO_2$ insulation layer (so-called vias) which are filled with tungsten or aluminium. Post-etch residues likewise form during dry etching of the vias. However, they have a different chemical composition than in the case of AlCu etching owing to the etching gases used.

Before further processing, the PERs must, as already stated, be removed completely from the conductor tracks and also from the vias.

The PERs are usually removed by means of wet cleaning processes. Organic solutions comprising complexing agents and water can be used here. Currently the most frequently used product EKC® 265 comprises the components hydroxylamine, monoethanolamine, catechol and water.

The problems associated with the removal of these polymer residues arise due to their chemical resistance compared with the AlCu base material. The aim is to remove these polymers without attacking the AlCu layer. Today, these polymers are removed by means of wet cleaning processes (dip or spray processes). A distinction is made here between two mechanisms:

The polymers are converted into a soluble form and then removed from the surface by dissolution. Long exposure times of in some cases up to ½ hour and elevated temperatures of up to about 90° C. support the dissolution process. Essentially organic solvents, amines, ethanolamine, catechol and reducing agents, such as hydroxylamine (HDA), are used in this process (Patent EP 4 85 161-A). Although these compounds have good cleaning actions, they have, however, the major disadvantage of being toxic. In addition, hydroxylamine is classified as carcinogenic. The solutions therefore have to be disposed of separately. Before the solutions can be rinsed off with water, an intermediate rinsing step with a water-soluble alcohol, usually isopropanol, is furthermore necessary. Handling of these solutions requires corresponding protective measures for health and environmental protection.

It is furthermore possible to remove the polymers by treatment with aqueous inorganic solutions. These are dilute solutions which may comprise sulfuric acid, hydrogen peroxide, ammonium fluoride or chromophosphoric acid (Patent EP 0 068 277). Small amounts of fluoride compounds, such as, for example, HF, accelerate the etching process, so that these mixtures are preferably employed in spin etchers in the single wafer process. Other acids, such as nitric acid (Patent EP 1 139 401 A1) or phosphoric acid, or ammonium hydrogenphosphate (Patent EP 1 063 689 A1) can also be used in these solutions. In the case of all these solutions, the AlCu metallisation beneath the polymer is slightly underetched, enabling it to be removed mechanically in a first step (lift off). Dissolution of the polymers then takes place. This process only allows a relatively small process window between complete cleaning and incipient etching of the AlCu metallisation. Cleaning of the vias in particular is unsatisfactory in many cases since the short process times are usually insufficient for complete dissolution of the polymers and the $SiO_2$ as the underlying layer is not underetched by the solutions as in the case of AlCu.

For illustration, FIG. 4 shows a wafer with AlCu conductor tracks and vias after cleaning under unfavourable conditions with a DSP solution (dilute sulfuric acid/peroxide) at 45° C. and 5 min. Considerable incipient etching of the AlCu metallisation and some polymer residues are clearly evident. In addition, the vias exhibit considerable incipient etching of the AlCu metallisation in the via base.

The object of the present invention is therefore to provide inexpensive, simple-to-prepare solutions for the removal of polymer residues or post-etch residues having an improved cleaning action which have reduced etching rates on metallisations, metal surfaces or conductor tracks. In particular, the object consists in providing cleaning solutions which have a reduced etching rate on surfaces or lines consisting of Al, Cu, Al/Cu, Ti, TiN, $SiO_2$ or W, but are also inert to surfaces consisting of stainless steel.

Invention:

The object is achieved by compositions based on aqueous solutions comprising at least one hydroxycarboxylic acid in the presence of suitable additives and which remove side-wall residues very effectively from vias and conductor tracks in the BEOL process in the semiconductor product production process.

Additives, such as wetting agents and corrosion inhibitors, facilitate use in a broad range or open a broad process window with respect to process time and process temperature. The corrosion inhibitor added in accordance with the invention greatly reduces, in particular, the etching rates of AlCu and tungsten during the application. The graph in FIG. 5 shows the removal of AlCu in nm as a function of the exposure time to the solution at 60° C. Even on addition of a few ppm of a suitable corrosion inhibitor, the removal of the metallisation layers by etching can be reduced to 0 nm. The removal of tungsten can in this way readily be reduced from 160 nm to 10 nm through the use of a cleaning solution according to the invention at an exposure time of 20 min at 60° C., as shown in FIG. 6. Particularly good results have been achieved with compositions in which the additives are present in amounts which are indicated below as being particularly preferred.

The achievable result is, in detail, dependent on the conditions of the preceding process steps and the resultant composition of the polymers formed. However, it is readily possible for the person skilled in the art to set the optimum mixing ratio of the components of the composition within the stated mixing ranges by means of a few experiments.

Process time and temperature can be matched variably to the requirements of the cleaning process on use of the compositions according to the invention without the metallisations or surfaces being attacked.

On use of aqueous, inorganic solutions usually employed, such as, for example, DSP or DSP+, in the case of which slight underetching of the aluminium/copper metallisation is intentionally utilised for the removal of the PERs (lift-off), there is a risk that the metal structures are attacked by overetching. This can go so far that pitting corrosion occurs. For this reason,
a) the exposure times must be kept very short in the case of these known compositions (about 1 minute, at most a few minutes) but
b) the cleaning process requires a minimum exposure time in order to remove or dissolve the PERs completely.

This narrow process window between incipient etching and complete cleaning action is often only achieved if the preceding reactive ion etching process has been correspondingly optimised. Particular difficulties arise in via cleaning, since underetching of the $SiO_2$ dielectric is not possible here.

Through experiments, it has, surprisingly, now been found that these disadvantages of the compositions usually used for this purpose can be avoided through the use of an aqueous formulation which comprises at least one hydroxycarboxylic acid, hydrogen peroxide and additives for improving the wetting of the wafer surface and for preventing corrosion.

The improved properties of the solutions according to the invention have proven particularly advantageous in the removal of so-called "post-etch residues". The latter are reaction products which form during dry etching from the constituents of the photoresist, the etching gases and the etched material. These reaction products are preferentially deposited on the side walls of the metallised areas, in particular the Al/Cu conductor tracks, and on the insides of the $SiO_2$ vias, as can be seen in FIG. 1. A particular advantage of the solutions according to the invention consists in the particularly effective cleaning of the vias and the metal conductor tracks without the underlying Al/Cu metallisation being attacked.

The solutions are environmentally friendly, non-toxic and can easily be neutralised and disposed of. The compositions have a low vapour pressure, do not represent an explosion risk and do not require fume extraction during the cleaning operation.

In addition, the compositions according to the invention can be prepared in high purity in accordance with the quality requirements in the semiconductor industry from high-purity commercially available substances usually used in the semiconductor industry.

Particularly positive results have arisen through the use of the novel solutions in via cleaning. Complete cleaning of the vias has taken place, as can be seen in FIG. 2, after a process time of only 5 minutes at 60° C. in a spray and tank processor. Addition of suitable surfactants to the solution ensures optimum wetting of the wafer surface and promotes the cleaning action. Optimum results have been achieved with process times of between 5 and 20 min, at a temperature in the range from 45 to 75° C., in particular in the range from 50 to 70° C., very particularly preferably in the range from 55 to 65° C., as can be seen in FIGS. 2 and 3.

The present invention provides compositions which result in significant improvements in the application. These consist, for example, in an extremely low etching rate on metallisations, such as, for example, on an Al/Cu metallisation or those comprising Al, Cu, Ti or W, or on TiN or $SiO_2$ layers. This facilitates exposure times of up to 30 min at a temperature of from 50 to 70° C., preferably 60° C. FIG. 4 shows a corresponding cleaning result. The solution according to the invention can successfully be employed both on spray tools and spin processors and in tank units. The cleaned wafers can be rinsed directly with ultrapure water and subsequently dried using nitrogen. An intermediate rinsing step as in the case of organic solutions (for example isopropanol) is superfluous.

As already mentioned above, this improved result can be illustrated very well with reference to SEM micrographs in FIGS. 1 to 3. In accordance with the invention, the cleaning action can be significantly improved by addition of additives, such as, for example, surfactant and NMP. The corrosion inhibitor employed reduces on the one hand the etching rate of tungsten, but on the other hand also of Al/Cu, as evident from FIGS. 4 and 5.

Suitable solutions according to the invention for the removal of PERs are preferably aqueous solutions comprising at least one organic acid selected from the group consisting of hydroxycarboxylic acids and/or di- and tricarboxylic acids. Suitable hydroxycarboxylic acids are glycolic acid, lactic acid, hydroxybutyric acid, glyceric acid, malic acid, tartaric acid, citric acid. Suitable dicarboxylic acids are malonic acid, succinic acid, glutaric acid, maleic acid. In addition to at least one organic acid, the composition according to the invention comprises at least one oxidant. Various oxidants are suitable, but preference is given to hydrogen peroxide and ammonium peroxodisulfate, which may be present in the solutions individually or in combination.

In addition, the solutions according to the invention may comprise a wide variety of additives for improving the cleaning action and for protecting the surfaces that are not to be attacked. Thus, it has proven advantageous for the solutions to comprise corrosion inhibitors. Imidazoline compounds as corrosion inhibitors are preferably added for the treatment of wafer surfaces having, for example, tungsten and aluminium metallisations. Suitable imidazoline compounds are benzimidazoles (alkyl-substituted imidazolines or 1,2-dialkylimidazolines), aminobenzimidazoles and 2-alkylbenzimidazoles. Particularly good cleaning results are achieved with solutions comprising oleic hydroxyethyl imidazoline as corrosion inhibitor.

In order to support the cleaning action and to protect the wafer surfaces, it is advantageous for an aprotic polar solvent to be added to the solution. Suitable aprotic polar solvents for this purpose are N-methylpyrrolidone (NMP), ethylene glycol, propylene glycol, dimethyl sulfoxide (DMSO), 1-methoxy-2-propyl acetate (PGMEA). These organic solvents may be present in the solution individually or as a mixture.

It has furthermore proven advantageous for the cleaning solution additionally to comprise surface-active substances.

Suitable surface-active substances have proven to be anionic surfactants. Particularly suitable surfactants are those selected from the group consisting of aliphatic carboxylic acids and/or from the group consisting of alkylbenzenesulfonic acids. Suitable aliphatic carboxylic acids are, for example, heptanoic acid and octanoic acid. An alkylbenzenesulfonic acid which can be employed is, inter alia, dodecylbenzenesulfonic acid.

Anionic surfactants can be employed together with nonionic surfactants or replaced thereby. Nonionic surfactants which can be employed are those from the group consisting of alkyl oxalkylates and/or alkylphenol oxethylates. Alkyl oxalkylates which are suitable for this purpose are, for example, fatty alcohol alkoxylates. An alkylphenol oxethylate which can be added is, inter alia, octylphenol oxethylate. Sorbitan compounds, such as polyoxyethylene sorbitan fatty acid esters, are furthermore suitable as surfactants in the solutions according to the invention. These include surfactants, such as, for example, products commercially available under the name Tween®.

The experiments carried out have shown that the solutions according to the invention exhibit significantly improved cleaning results compared with cleaning solutions known to date at temperatures in the range from 40 to 70° C.

Surprisingly, it is possible to achieve significantly improved cleaning results with the solutions according to the invention than with compositions known to date in a cleaning time (stripping time) of from one minute to 60 minutes. It is advantageous that the PERs can be removed completely during the cleaning operation, but neither the metallised conductor tracks nor other surfaces, such as, for example, comprising TiN or $SiO_2$, are attacked to a noticeable extent.

Cleaning solutions according to the invention having improved cleaning actions can therefore have compositions as shown in the following table:

TABLE 1

|  | 1 | 2 | 3 | 4 | 5 | 6 | 7 | 8 |
|---|---|---|---|---|---|---|---|---|
| Organic acid | x | x | x | X | x | x | x | x |
| Oxidant | x | x | x | X | x | x | x | x |
| Solvent |  |  | x | X |  |  | x | x |
| Surfactant |  | x |  | X |  | x |  | x |
| Corrosion inhibitor |  |  |  |  | x | x | x | x |

The aqueous cleaning solutions according to the invention may comprise the individual components as follows:
organic acid from the group consisting of hydroxycarboxylic acids and/or di- and tricarboxylic acids in an amount of from 0.1 to 30%
oxidant in an amount of from 0.1 to 10%
corrosion inhibitors, for example from the group consisting of imidazoline compounds, for tungsten and aluminium in an amount of from 1 ppm to 1%
aprotic polar solvent in an amount of from 0.1 to 10%
anionic surfactant from the group consisting of aliphatic carboxylic acids and alkylbenzenesulfonic acids in an amount of from 1 ppm to 1%
and/or
nonionic surfactant from the group consisting of alkyl oxalkylates, alkylphenol oxethylates and sorbitan compounds in an amount of from 1 ppm to 1%

Suitable cleaning solutions having improved properties may therefore comprise the components in the following amounts:

| di-, tri- or hydroxycarboxylic acid | 0.1 to 30% |
| hydrogen peroxide | 0.1 to 30% |
| N-methylpyrrolidone and/or DMSO | 0.1 to 10% |
| corrosion inhibitor | 1 ppm to 1% |
| anionic or nonionic surfactant | 1 ppm to 1% |

Particularly good cleaning results can be achieved with compositions consisting of the following components:

| acid (citric acid, maleic acid, tartaric acid) | 5 (+/−2) % |
| hydrogen peroxide | 2 (+/−0.5) % |
| solvent (NMP, DMSO, PGMEA) | 1 (+/−0.5) % |
| corrosion inhibitor (oleic hydroxyethyl imidazoline) | 100 to 1000 ppm |
| wetting agent (enanthic acid, Triton X100, Tween 20, dodecylbenzenesulfonic acid, Plurafac 120) | 100 to 1000 ppm |

Particularly suitable are solutions comprising, for example, the said components in the following amounts:

| citric acid | 0.1 to 30% |
| hydrogen peroxide | 0.1 to 10% |
| N-methylpyrrolidone NMP | 0.1 to 10% |
| corrosion inhibitor | 1 to 1000 ppm |
| wetting agent | 1 to 1000 ppm |

Very particularly favourable properties are exhibited in this connection by compositions comprising the following components in the stated amounts:

| citric acid | 5 (+/−2) |
| hydrogen peroxide | 2 (+/−1) % |
| N-methylpyrrolidone NMP | 1 (+/−0.5) % |
| corrosion inhibitor (oleic hydroxyethyl imidazoline) | 50 to 1000 ppm |
| wetting agent | 100 to 1000 ppm |

The above-mentioned mixtures have proven very effective, particularly in the case of difficult via cleaning, see FIG. 2.

Treatment of the wafer surfaces with the aqueous solutions according to the invention not only removes the PERs from the surfaces, but also simultaneously frees the surfaces from adherent interfering particles. This has the advantage that complex cleaning steps after the removal of the PERs are superfluous.

The compositions according to the invention are advantageously stable compositions which do not exhibit decomposition even after extended storage time. As already mentioned above, the compositions are environmentally friendly and can be disposed of simply. They can be employed in spray units and in tank processors. If desired, they can also be recycled.

All percentage data in the present description are percent by weight, based on the total amount of the solutions. It goes without saying here that the amounts of the added components in a composition add up to 100%.

EXAMPLES

For better understanding and in order to illustrate the invention, examples are reproduced below, also in the form of pictures which show the cleaning result. The compositions used are within the scope of protection of the present invention. The examples thus also serve to illustrate the invention. Owing to the general validity of the inventive principle described, however, the examples are not suitable for reducing the scope of protection of the present application merely to these.

The temperatures given in the examples are always in ° C.

Example 1

Reference (post-ash residue) before cleaning: see vias of FIG. 14 and AlCu lines of FIG. 15.

The cleaning is carried out with an aqueous cleaning solution comprising the following components:

| | |
|---|---|
| citric acid | 5% |
| hydrogen peroxide | 2% |
| NMP | 1% |
| Tween 20 | 1000 ppm |

Process parameters for Semitool SAT spray tool:

| Step | Name | Time | RPM | Temp. | | DRAIN |
|---|---|---|---|---|---|---|
| 1 | Polymer removal | 5 min | 50 rpm | 60° C. | | Tank |
| 2 | Purge | 10 sec | 50 rpm | | N2 | Tank |
| 3 | DI rinse 1 | 5 min | 50 rpm | RT | H2O | Drain |
| 4 | DI rinse 2 | 2 min | 300 rpm | RT | | |
| 4 | Purge | 10 sec | 300 rpm | | N2 | Drain |
| 5 | Dry 1 | 2 min | 750 rpm | hot | N2 | |
| 6 | Dry 2 | 8 min | 300 rpm | hot | N2 | |

See AlCu lines of FIG. 16 and via of FIG. 17.

Example 2

The cleaning is carried out with an aqueous cleaning solution comprising the following components:

| | |
|---|---|
| citric acid | 5% |
| hydrogen peroxide | 2% |
| oleic hydroxyethyl imidazoline | 1000 ppm |

Process parameters for Arias wet bench

| STEP | NAME | TIME | Temp | | Drain |
|---|---|---|---|---|---|
| 1 | Polymer removal | 20 min | 60° C. | | |
| 2 | D1 rinse 1 | 10 min | RT | H2O | |
| 3 | Dry1 | 2 min | hot | N2 | |
| 4 | Dry2 | 8 min | hot | N2 | |

See AlCu lines of FIG. 18 and via of FIG. 19.

Example 3

Comparison with a commercially available organic polymer remover
1. Polymer remover (comprises hydroxylamine, catechol, monoethanolamine) 75° C., 20 min (beaker)
2. IPA RT, 3 min
3. DI water RT, 5 min
4. N2 blow drying Incipient etching of the AlCu metallisation was observed: see FIG. 20.
1. Citric acid 5%/peroxide 2%/NMP 1%/Tween 20 1000 ppm 60° C., 20 min (beaker)
2. DI water 10 min
3. N2 blow drying No etching of the AlCu metallisation was observed: see FIG. 21.

BRIEF DESCRIPTION OF THE DRAWINGS

FIG. 1: Vias before PER cleaning.
FIG. 2: Vias after cleaning for 5 minutes—tank unit.
FIG. 3: Vias after cleaning for 20 minutes—spray tool (Semitool SAT).
FIG. 4: AlCu lines and vias after cleaning for 5 minutes at 45° C. with a DSP solution (dilute sulfuric acid/peroxide)—spray tool (Semitool SAT).
FIG. 7: Via and AlCu lines after cleaning for 20 minutes at 60° C. with a solution of 5% tartaric acid, 1% NMP and 1000 ppm of enanthic acid.
FIG. 8: Vias and AlCu lines after cleaning for 20 minutes at 60° C. with a solution of 5% tartaric acid, 1% DMSO and 1000 ppm of enanthic acid.
FIG. 9: Vias and AlCu lines after cleaning for 20 minutes at 60° C. with a solution of 5% tartaric acid, 1% PGMEA and 1000 ppm of enanthic acid.
FIG. 10: Via and AlCu lines after cleaning for 20 minutes at 60° C. with a solution of 5% maleic acid, 1% NMP and 1000 ppm of enanthic acid.
FIG. 11: Via and AlCu lines after cleaning for 20 minutes at 60° C. with a solution of 5% maleic acid, 1% DMSO and 1000 ppm of enanthic acid.
FIG. 12: Vias after cleaning for 20 minutes at 60° C. with a solution of 5% maleic acid, 1% PGMEA and 1000 ppm of enanthic acid.

Figure 5:
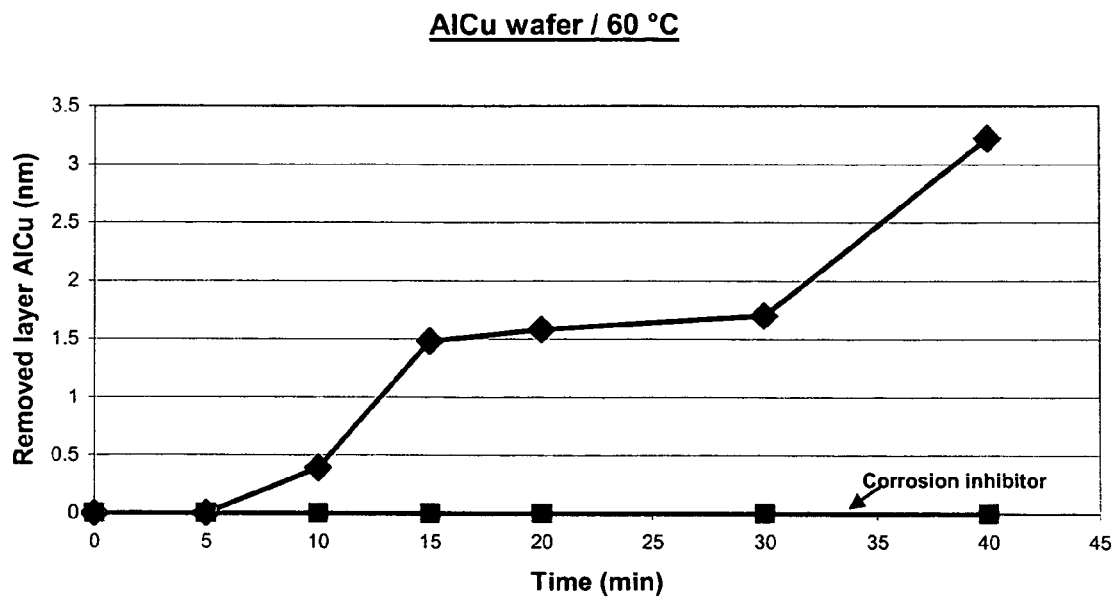
FIG. 5: Plot of mass removal of a sputtered Al/Cu layer as a function of exposure time. The solution used consisted of an aqueous solution of 5% of citric acid, 2% of peroxide, 1% of NMP. The dark curve shows removal without corrosion inhibitor. The pale line shows removal with addition of a corrosion inhibitor.
Figure 6:
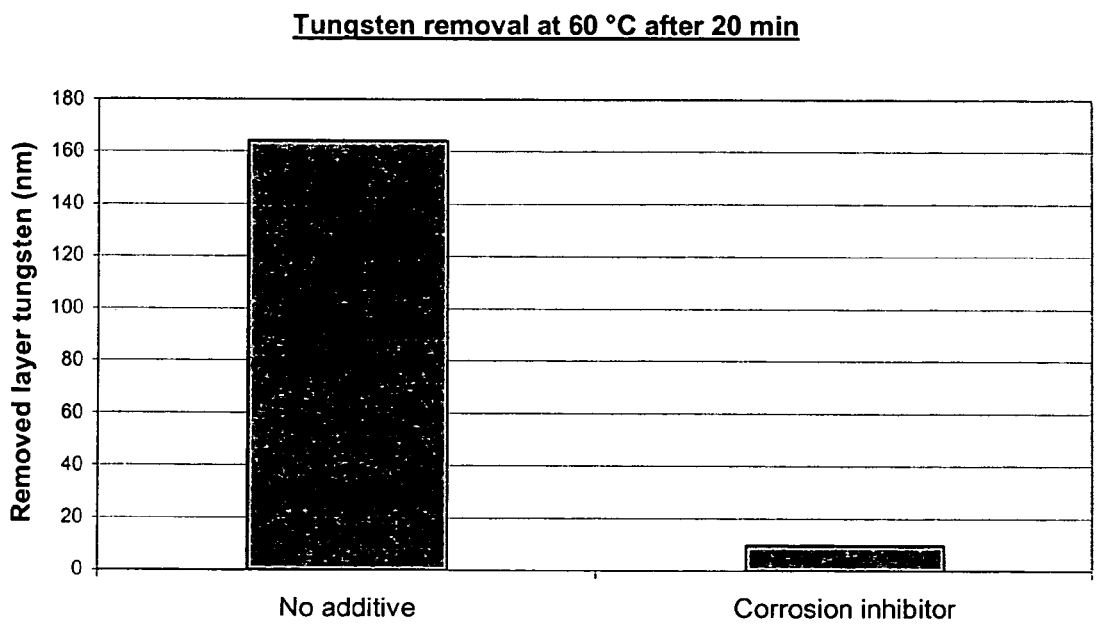
FIG. 6: Plot of mass removal of a CVO-deposited tungsten layer as a function of exposure time. The solution used (see FIG. 5).
Figure 13:
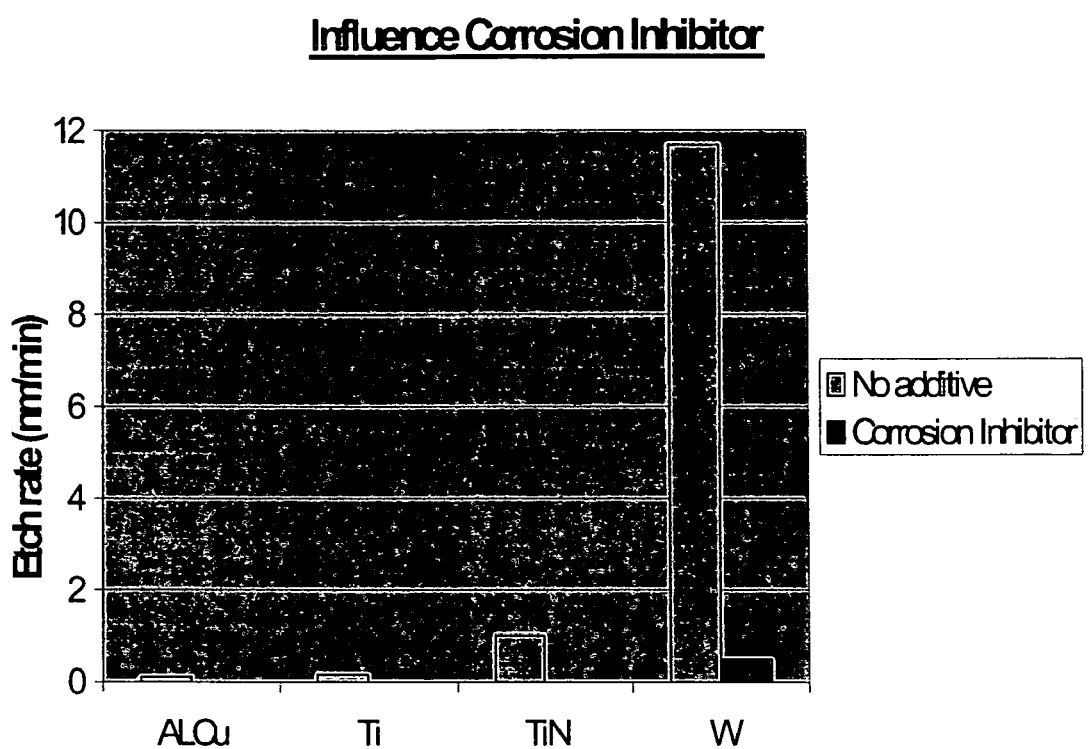
FIG. 13: Plot of the etching rate (removal/time) of various coatings, with/without addition of a corrosion inhibitor to the solution (see FIG. 5).
Figure 14:
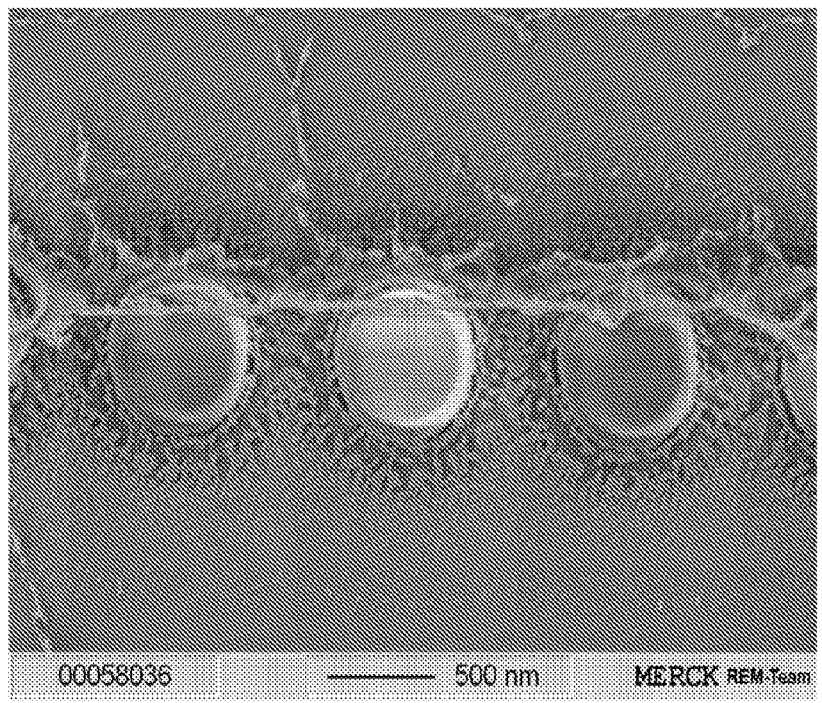
FIG. 14: Example 1 reference (post-ash residue) before cleaning—vias.
Figure 15:
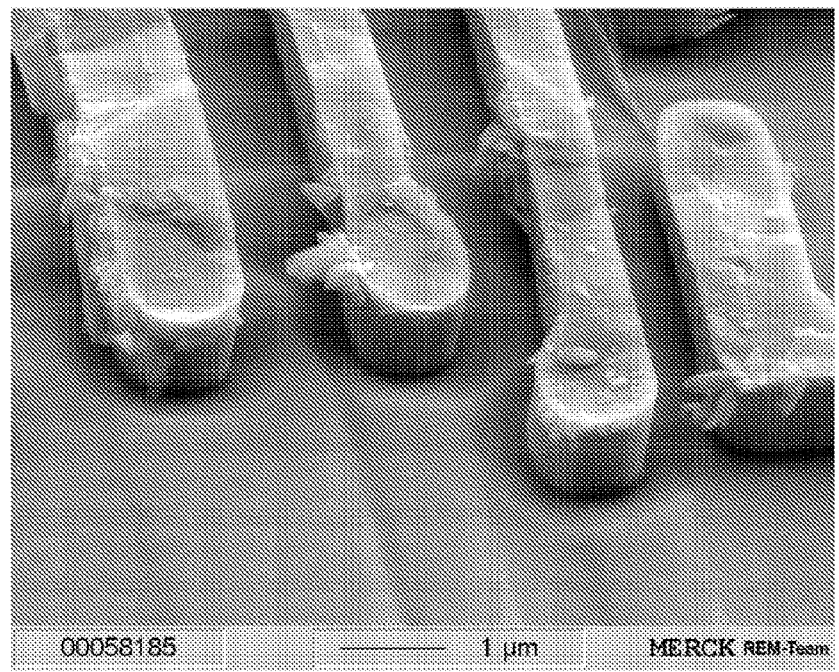
FIG. 15: Example 1 reference (post-ash residue) before cleaning—AlCu lines.
Figure 16:
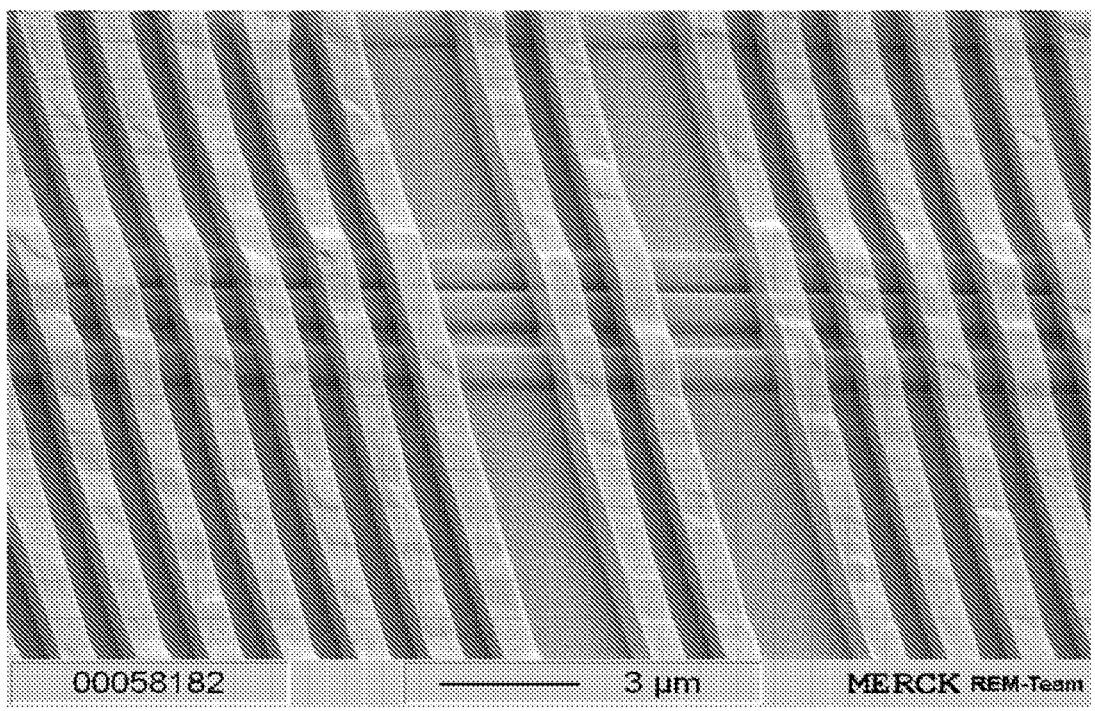
FIG. 16: Example 1 after cleaning—AlCu lines.
Figure 17:
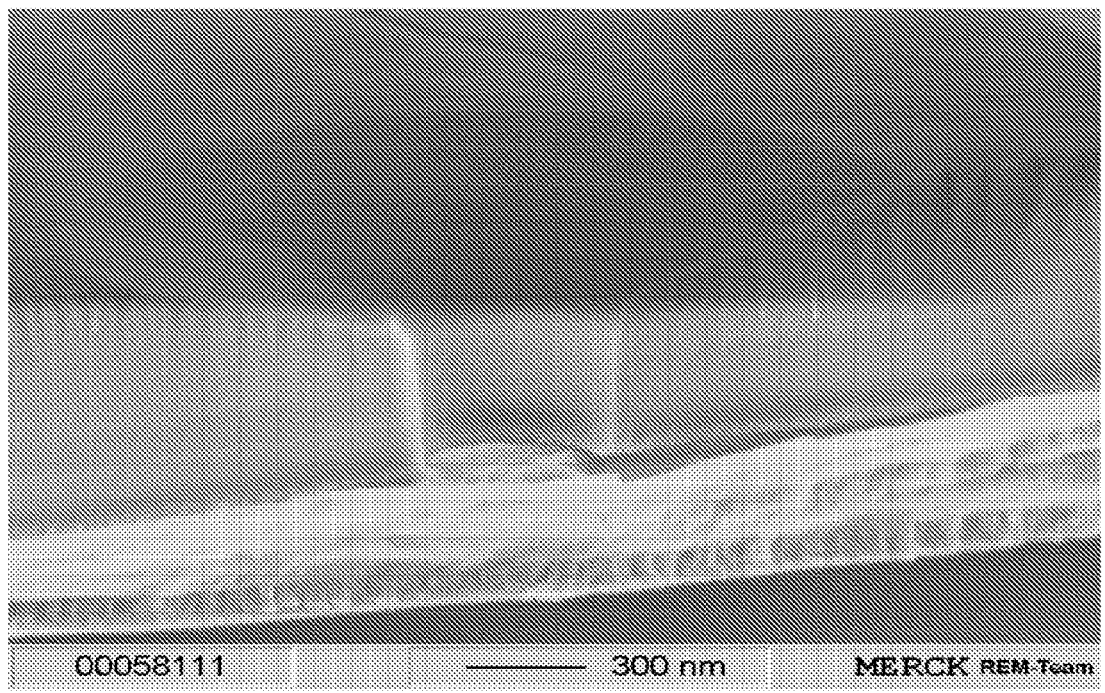
FIG. 17: Example 1 after cleaning—via.
Figure 18:
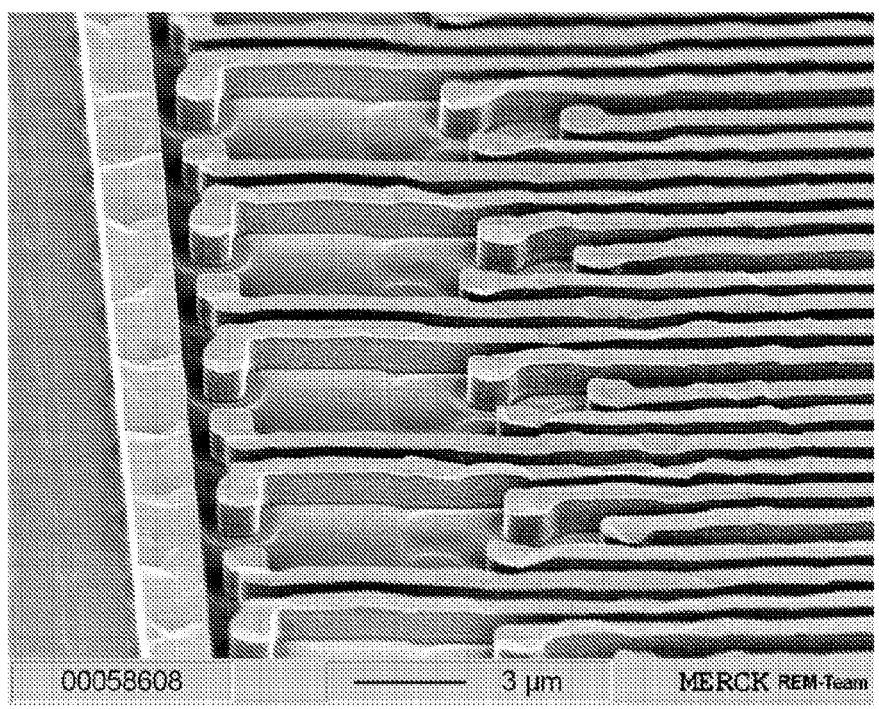
FIG. 18: Example 2 after cleaning—AlCu lines.
Figure 19:
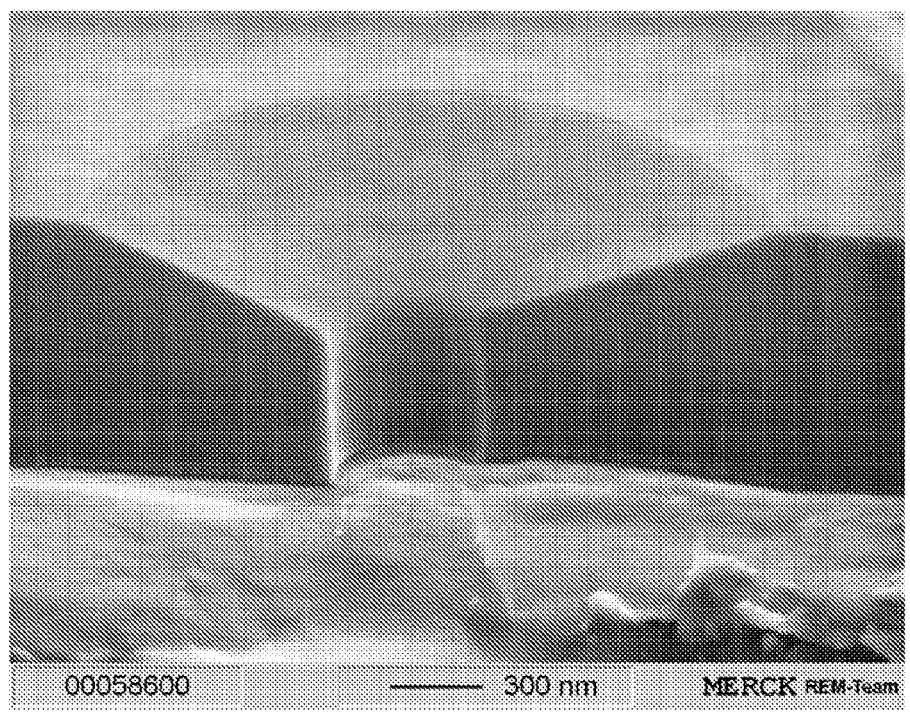
FIG. 19: Example 2 after cleaning—via.
Figure 20:
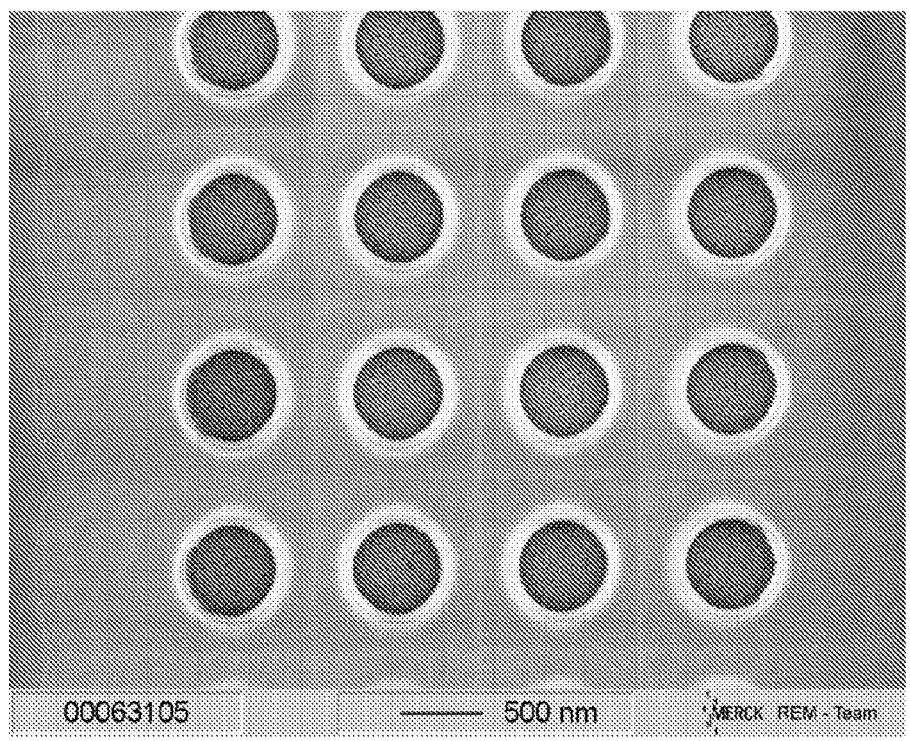
FIG. 20: Example 3, commercially available organic polymer remover, incipient etching of the AlCu metallisation was observed.
Figure 21:
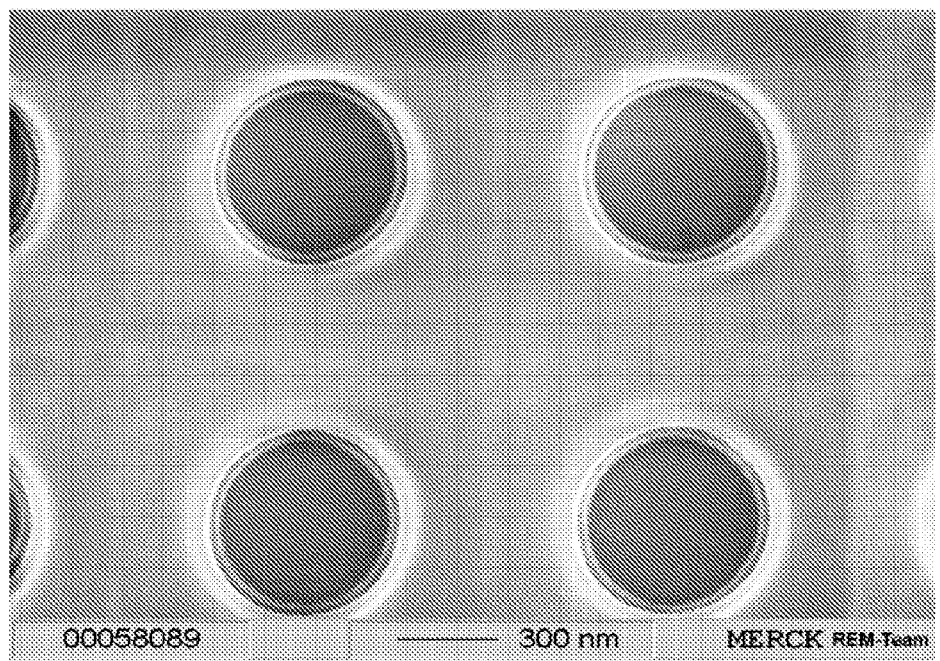
FIG. 21: Example 3, present invention, no etching of the AlCu metallisation was observed.

The invention claimed is:
1. Aqueous solution for post-etch residue removal having a reduced etching rate, comprising:
  at least one hydroxycarboxylic acid in an amount of from 0.1 to 30%, based on the total weight of the solution, hydrogen peroxide in an amount of from 0.1 to 10%, based on the total weight of the solution, at least one corrosion inhibitor selected from the group consisting of imidazoline compounds, and optionally, additives for improving the cleaning action and inertisation to Al, Cu, Ti, W, Al/Cu, TiN and $SiO_2$ surfaces.

2. Aqueous solution according to claim 1, wherein the at least one corrosion inhibitor is selected from the group consisting of benzimidazoles, aminobenzimidazoles and 2-alkylbenzimidazoles.

3. Aqueous solution according to claim 1, comprising at least one aprotic polar solvent.

4. Aqueous solution according to claim 3, wherein the at least one aprotic polar solvent is selected from the group consisting of N-methylpyrrolidone (NMP), ethylene glycol, propylene glycol, dimethyl sulfoxide (DMSO) and 1-methoxy-2-propyl acetate (PGMEA).

5. Aqueous solution according to claim 1, comprising at least one surfactant.

6. Aqueous solution according to claim 5, wherein the at least one surfactant is selected from the group consisting of an anionic surfactant and a nonionic surfactant.

7. Aqueous solution according to claim 6, wherein the anionic surfactant is selected from the group consisting of aliphatic carboxylic acids and alkylbenzenesulfonic acids and the nonionic surfactant is selected from the group consisting of alkyl oxalkylates and alkylphenol oxethylates.

8. Aqueous solution according to claim 7, wherein the anionic surfactant is selected from the group consisting of heptanoic acid, octanoic acid and dodecylbenzenesulfonic acid and the nonionic surfactant is selected from the group consisting of fatty alcohol alkoxylates, octylphenol oxethylates and polyoxyethylene sorbitan fatty acid esters.

9. Aqueous solution according to claim 1, wherein the at least one hydroxycarboxylic acid is selected from the group consisting of glycolic acid, lactic acid, hydroxybutyric acid, glyceric acid, malic acid, tartaric acid, citric acid, malonic acid, succinic acid, glutaric acid and maleic acid.

10. Aqueous solution according to claim 1, wherein the at least one corrosion inhibitor is present in an amount of from 1 ppm to 1%, based on the total weight of the solution.

11. Aqueous solution according to claim 3, wherein the at least one aprotic polar solvent is present in an amount of from 0.1 to 10%, based on the total weight of the solution.

12. Aqueous solution according to claim 6, wherein the anionic surfactant is present in an amount of from 1 ppm to 1%, based on the total weight of the solution, and/or at least one and the nonionic surfactant is present in an amount of from 1 ppm to 1%, based on the total weight of the solution.

13. Aqueous solution according to claim 3, wherein said aqueous solution comprises citric acid as the at least one hydroxycarboxylic acid, hydrogen peroxide, N-methylpyrrolidone (NMP) as the at least one aprotic polar solvent and optionally additives.

14. Solution according to claim 13, wherein the citric acid is present in an amount of from 0.1 to 30%, the hydrogen peroxide is present in an amount of from 0.1 to 10% and the N-methylpyrrolidone is present in an amount of from 0.1 to 10%.

15. Solution according to claim 13, wherein the at least one corrosion inhibitor is present in an amount of from 1 ppm to 10,000 ppm and a surfactant is present in an amount of from 1 ppm to 1%.

16. The method of using an aqueous solution according to claim 1 for the production of semiconductors on spray tools or in tank units.

17. Aqueous solution according to claim 1, wherein the at least one hydroxycarboxylic acid is present in an amount of from 3 to 7%, based on the total weight of the solution, the hydrogen peroxide is present in an amount of from 1 to 3%, based on the total weight of the solution, at least one aprotic polar solvent present in an amount of from 0.5 to 1.5%, based on the total weight of the solution, the at least one corrosion inhibitor is present in an amount of from 1 ppm to 1%, based on the total weight of the solution, and a surfactant present in an amount of from 1 ppm to 1%, based on the total weight of the solution.

18. A process for removing side-wall residue from a semiconductor device after dry etching, said process comprising contacting a semiconductor substrate with the aqueous solution according to claim 1.

* * * * *